United States Patent [19]

Kobatake

[11] Patent Number: 4,924,438
[45] Date of Patent: May 8, 1990

[54] NON-VOLATILE SEMICONDUCTOR MEMORY INCLUDING A HIGH VOLTAGE SWITCHING CIRCUIT

[75] Inventor: Hiroyuki Kobatake, Tokyo, Japan
[73] Assignee: NEC Corporation, Tokyo, Japan
[21] Appl. No.: 268,607
[22] Filed: Nov. 7, 1988

Related U.S. Application Data

[63] Continuation of Ser. No. 814,473, Dec. 30, 1985, abandoned.

[30] Foreign Application Priority Data

Dec. 28, 1984 [JP] Japan ................................ 59-277436

[51] Int. Cl.$^5$ .............................................. G11C 11/40
[52] U.S. Cl. ................................ 365/185; 365/230.06; 365/189.09
[58] Field of Search ............... 365/104, 184, 185, 226, 365/230, 189, 182; 307/296 R, 297

[56] References Cited

U.S. PATENT DOCUMENTS

| | | | |
|---|---|---|---|
| 4,511,811 | 4/1985 | Gupta | 365/184 |
| 4,533,934 | 8/1985 | Smith | 365/104 |
| 4,583,205 | 4/1986 | Watanabe | 365/230 |
| 4,597,062 | 6/1986 | Asano et al. | 365/182 |
| 4,638,466 | 1/1987 | Fukumoto | 365/104 |

FOREIGN PATENT DOCUMENTS

| 0029716 | 6/1981 | European Pat. Off. | 365/104 |
|---|---|---|---|
| 2049327 | 12/1980 | United Kingdom | 365/104 |

Primary Examiner—Glenn A. Gossage
Attorney, Agent, or Firm—Sughrue, Mion, Zinn, Macpeak & Seas

[57] ABSTRACT

A non-volatile semiconductor memory device has a plurality of memory cells which are coupled to a plurality of row or column lines through which a high voltage is supplied in a data write operation and a plurality of switching circuits, each of which is coupled to the corresponding row or column line. In a data write operation, only one of switching circuits is turned on to supply the high voltage to only one row or column lines coupled to a memory cell in which a data is to be written.

6 Claims, 5 Drawing Sheets

NON-VOLATILE SEMICONDUCTOR MEMORY INCLUDING A HIGH VOLTAGE SWITCHING CIRCUIT

This is a continuation of application Ser. No. 06/814,473, filed 12/30/85, now abandoned.

BACKGROUND OF THE INVENTION

1. Field of the Invention

The present invention relates to a non-volatile semiconductor memory device, and more particularly to a data write circuit employing a high write voltage in such a non-volatile semiconductor memory device.

2. Description of the Prior Art

An electrically programmable, non-volatile read-only memory (referred to as an EPROM) has a plurality of memory cells arranged in a matrix of word lines and digit lines, and data is written into a selected memory cell by applying a high voltage thereto through a selected word line or a selected digit line. In a writing operation, it is required that the high voltage be applied to the selected word line or digit line only, and that all the other non-selected word lines or digit lines be grounded or clamped at a fixed low potential. This wastes a large amount of current flowing through all the non-selected word or digit lines to the ground or the fixed potential source during the data writing operation period. Such a large power consumption is one of the shortcomings of the prior art EPROM.

The large amount of current flowing from a high voltage terminal to which the high voltage is supplied toward the ground or the low potential source causes a voltage level drop at the high voltage terminal. Taking into consideration in that the high voltage level which is sufficient to write data to the respective memory cells is not constant because of deviations in semiconductor fabrication, the dropped high voltage sometimes fails to correctly write data into some memory cells. This is another drawback of the conventional EPROM. This drawback may be resolved by providing the memory chip with a plurality of high voltage terminals to enable the application of a high voltage to the selected word or digit line. However, this is not practical, because the number of terminals is limited on the memory chip and it is impossible to assign many terminals for supplying a high voltage.

SUMMARY OF THE INVENTION

An object of the present invention is to provide a semiconductor memory in which wasteful current flowing through the non-selected word or digit lines from a high voltage terminal is suppressed.

Another object of the present invention is to provide a semiconductor memory in having no voltage level drop at the high voltage terminal.

Still another object of the present invention is to provide a semiconductor memory having a write-control circuit by which correct data can be written into a selected memory cell with high reliability.

The semiconductor memory according to the present invention comprises a plurality of row lines, at least one column line, a plurality of memory cells coupled to the row lines and the column line, a high voltage terminal receiving a high voltage in a data writing operation, terminals receiving an address input signal, a selector circuit coupled to the plurality of row lines and the column line and selecting one of memory cells according to the address input signal, and a plurality of switching circuits coupled between the high voltage terminal and the row lines. First ends of the switching circuits are coupled to the respective row lines and the other ends are commonly coupled to the high voltage terminal. Only one of the switching circuits is turned on in response to the address input signal in the data writing operation.

According to the present invention, only one row line to which a memory cell designated by the address input signal is connected is coupled to the high voltage terminal via the one turned-on switching circuit, while all the other row lines are electrically cut off from the high voltage terminal because the other switching circuits are turned off. Therefore, no current flows through the non-selected row lines. Thus, power consumption is remarkably reduced in the data writing operation, and therefore the voltage level at the high voltage terminal does not drop. As the result, correct data can be written into any memory cell with high reliability.

In the present invention, each switching circuit has a plurality of enhancement type transistors equal in number to the number of address bits used to select one of the row lines, and a plurality of depletion type transistors equal in number to the enhancement type transistors. These enhancement type transistors and depletion type transistors are serially coupled with each other according to a predetermined order and are inserted between a row line and the high voltage terminal. Further, the true and complementary signals of the address bits are applied to each transistor. That is, the switching circuit operates as a writing decoder responsive to a writing address. Therefore, the EPROM of the present invention has both a reading decoder and a writing decoder in one semiconductor reading decoder and a writing decoder in one semiconductor chip. The reading decoder is coupled to one end of a row line and the writing decoder is coupled between the other end of the row line and the high voltage terminal.

As described above, each switching circuit can be constructed by serially coupled transistors, so that it can be formed within the memory cell pitch (span) of a conventional EPROM. Therefore, in the present invention, the switching circuits can be provided without extending the memory cell span, so that the memory capacity of a memory array of a given size is not reduced.

Furthermore, gate circuit may be inserted between the row lines and the switching circuit to electrically decouple the switching circuit from the row line in a data reading operation. In this case the gate circuit is turned off in responsive to a read control signal in a data reading operation to electrically separate the row line from the switching circuit. Thus, in the read operation, the row line connected to a memory cell from which data is read out is decoupled from the respective switching circuit. That is, the stray capacitance added by the switching circuit is electrically cut off from the row line. As a result, the memory cell connected to the row line is activated at high speed in response to an address, so that the data can be read out of the memory cell at high speed.

DETAILED DESCRIPTION OF THE PREFERRED EMBODIMENTS

Figure 1:
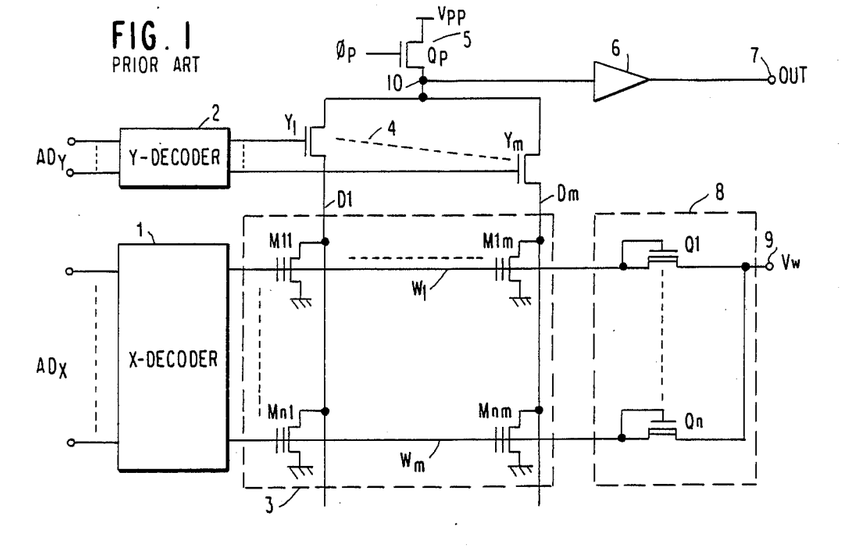
FIG. 1 shows a block diagram of a prior art EPROM.

Referring to FIG. 1, a conventional EPROM will be explained in the following. The EPROM includes an X-decoder receiving a part ($AD_X$) of an address, a Y-decoder receiving the other part ($AD_Y$) of the address, a memory cell array 3 having a plurality of memory cells ($M_{11}$ to $M_{nm}$) arranged in a matrix shape, a Y-selector 4, a writing circuit 8 connected to a high voltage terminal $V_W$ 9, a precharge transistor $Q_p$ 5 and a sense amplifier 6 coupled to a data output terminal 7. Each output end of the X-decoder is coupled to a respective word line $W_1$ to $W_m$, so that one word line is selected according an address $AD_X$. In a data read operation, a plurality of data stored in a plurality of memory cells ($M_{il}$ to $M_{im}$) connected to a selected word line $W_i$ are simultaneously read out to the respective digit lines $D_1$ to $D_n$. One of the read-out data is selected by the Y-selector 4 according to an output of the Y-decoder 2. The selected data is taken out from the output terminal 7 via the sense Amplifier 6. Before data are read out of the memory cells, a node 10 connected to the sense amplifier 6 is preliminary precharged to Vpp through the precharge transistor $Q_p$ 5 responsive to a precharge control signal $\phi_p$.

In the conventional EPROM, when data is written into a memory cell (e.g. $M_{11}$), an address designating the memory cell $M_{11}$ is applied to the X-decoder 1 and Y-decoder 2. The X-decoder 1 electrically disconnects only one word line $W_1$ from ground (GND) and couples all word lines $W_2$ to $W_m$ except for $W_1$ to grund (GND). On the other hand, the Y-decoder 2 selects the transistor $Y_1$ connected to the digit line $D_1$ according to the address $AD_Y$, so that a predetermined voltage is supplied to the drain electrode of the memory cell $M_{11}$ through the transistor $Y_1$. Thus, a high voltage at the terminal $V_W$ 9 is supplied to the control gate of the designated memory cell $M_{11}$ through a high impedance load transistor $Q_1$ and the word line $W_1$, and data is written thereinto. The written data can be erased by applying ultra-violet rays in this EPROM.

According to the conventional EPROM, all of the non-selected word lines are connected to ground, so that a plurality of electrical paths through the non-selected word lines $W_2$ to $W_m$ from the terminal $V_W$ 9 to ground are formed. As a result, a large amount of power is consumed. Furthermore, the voltage level at the terminal $V_W$ 9 drops resulting from the current flowing through these electrical paths. Therefore, the conventional EPROM has shortcomings in that correct data can not be written into some memory cells due to the voltage drop.

Figure 2:
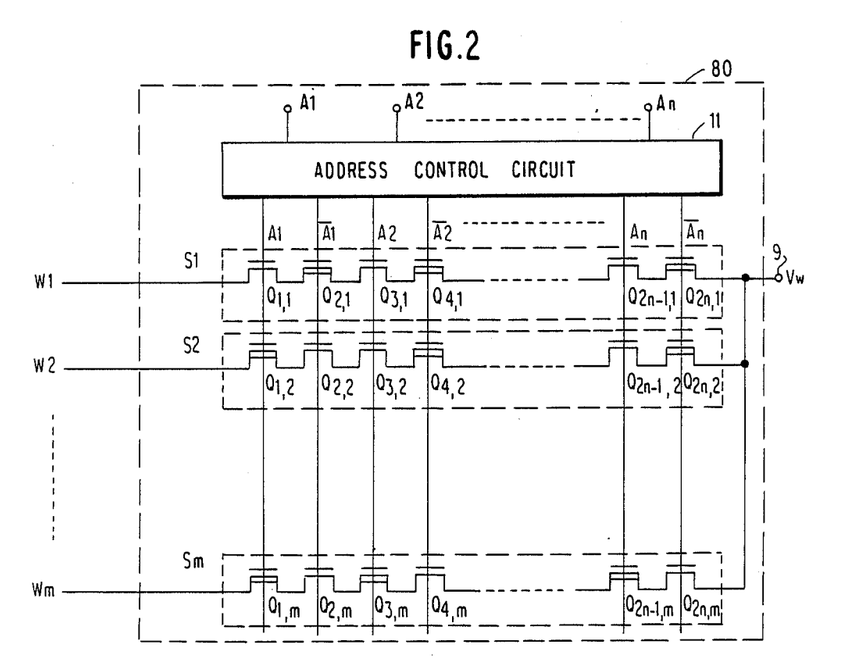
FIG. 2 shows a circuit diagram of a writing circuit according to an embodiment of the present invention.

FIG. 2 shows a circuit diagram of a writing circuit according to an embodiment of the present invention. The writing circuit 80 shown in FIG. 2 can replace the writing circuit 8 of FIG. 1. The writing circuit 80 has switching circuits $S_1$ to $S_m$ equal in number to the word lines $W_1$ to $W_m$ and an address control circuit 11. The address control circuit 11 receives the address $AD_X$($A_1$ to $A_n$) to be applied to the X-decoder 1 and products true signals $A_1$ to $A_n$ and complementary signals $\overline{A}_1$ to $\overline{A}_n$ which are inverted signals $A_1$ to $A_n$. Each switching circuit $S_1$ to $S_m$ includes n enhancement type P-channel MOS FETs (referred to as E-PFET) and n depletion type P-channel MOS FETs (referred to as D-PFET) which are connected in series according to a predetermined order as described hereinafter. In FIG. 2, $Q_{1.1}$, $Q_{3.1}$, $Q_{2.2}$ and the like are D-PFET. The true output lines $A_1$, $A_2$, ... $_n$ and the complementary output lines $\overline{A}_1$, $\overline{A}_2$, ... $\overline{A}_n$ are alternately wired.

Now, Table 1 shows the arrangement of E-PFETs and D-PFETs in each switching circuit which a 4-bit address having its $A_1$–$A_4$ is employed.

TABLE 1

|  | $A_1$ | $\overline{A}_1$ | $A_2$ | $\overline{A}_2$ | $A_3$ | $\overline{A}_3$ | $A_4$ | $\overline{A}_4$ |
|---|---|---|---|---|---|---|---|---|
| $W_1$ | E | D | E | D | E | D | E | D |
| $W_2$ | D | E | E | D | E | D | E | D |
| $W_3$ | E | D | D | E | E | D | E | D |
| $W_4$ | D | E | D | E | E | D | E | D |
| $W_5$ | E | D | E | D | D | E | E | D |
| $W_6$ | D | E | E | D | D | E | E | D |
| $W_7$ | E | D | D | E | D | E | E | D |
| $W_8$ | D | E | D | E | D | E | E | D |
| $W_9$ | E | D | E | D | E | D | D | E |
| $W_{10}$ | D | E | E | D | E | D | D | E |
| $W_{11}$ | E | D | D | E | E | D | D | E |
| $W_{12}$ | D | E | D | E | E | D | D | E |
| $W_{13}$ | E | D | E | D | D | E | D | E |
| $W_{14}$ | D | E | E | D | D | E | D | E |
| $W_{15}$ | E | D | D | E | D | E | D | E |
| $W_{16}$ | D | E | D | E | D | E | D | E |

E-PFETs and D-PFETs are arranged according to the example of Table 1 in each switching circuit. Thus, only one switching circuit is turned on, while the others are all turned off. That is, all FETs in the switching circuit corresponding to a word line selected by an address are turned on, while at least one FET in the other switching circuits is turned off. Therefore, the high voltage terminal $V_W$ 9 is coupled to the selected word line only and is decoupled from all non-selected word lines. As a result, the current paths of the conventional EPROM are not formed in this embodiment. Therefore, power consumption can be remarkably reduced. In addition, since the voltage level at the terminal $V_W$ 9 does not drop, correct data can be written into all memory cells.

Figure 3:
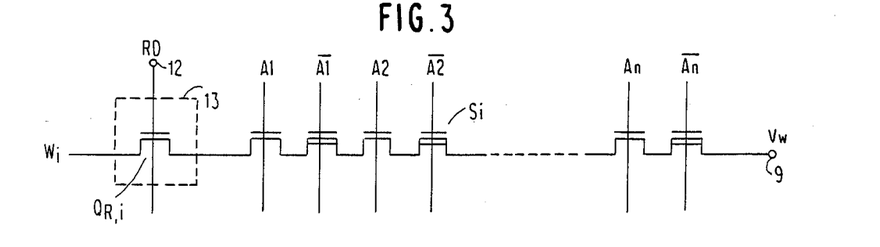
FIG. 3 shows a circuit diagram of a switching circuit according to another embodiment of the present invention.

FIG. 3 shows a circuit diagram of a switching circuit according to another embodiment of the present invention. In this embodiment, a gate circuit 13 having an E-PFET $Q_{Ri}$ is inserted between the word line $W_i$ and the switching circuit $S_i$. The E-PFET $Q_{Ri}$ is controlled by a read control signal RD applied to a read control terminal 12. The read control signal RD is activated in a data read operation and is applied to a gate electrode of the E-PFET $Q_{Ri}$. Thus, the E-PFET $Q_{Ri}$ is turned off, so that the word line $W_i$ is electrically separated from the switching circuit $S_i$. Therefore, since the stray capacitance added by the switching circuit $S_i$ is decoupled from the word line $W_i$, the read operation speed is not slowed down. For a plurality of word lines $W_1$ to $W_m$, a plurality of gate circuits 13 must be inserted between each word line and the respective switching circuits, respectively. Of course, the gate circuit 13 is turned on in the data write operation.

Figure 4:
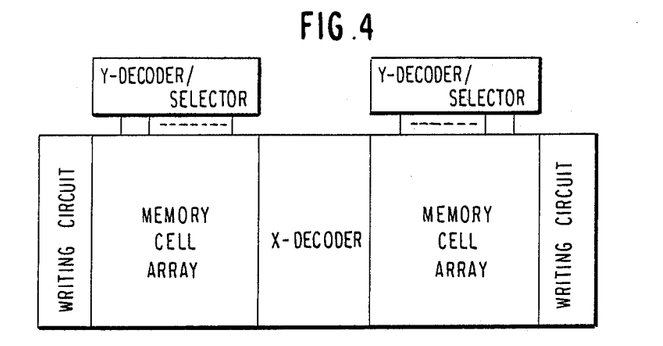
FIG. 4 shows a block diagram indicating a layout pattern of a principal part of an EPROM to which the present invention is applied.

FIG. 4 shows a block diagram indicating the layout pattern of an EPROM chip wherein the present invention is applied. Two memory cell arrays are provided on either side of an X-deocder, and Y-decoder selector units are respectively coupled to two memory cell arrays, respectively. Two writing circuits as shown in FIG. 2 are used and are coupled to the memory cell arrays, respectively.

Figure 5:
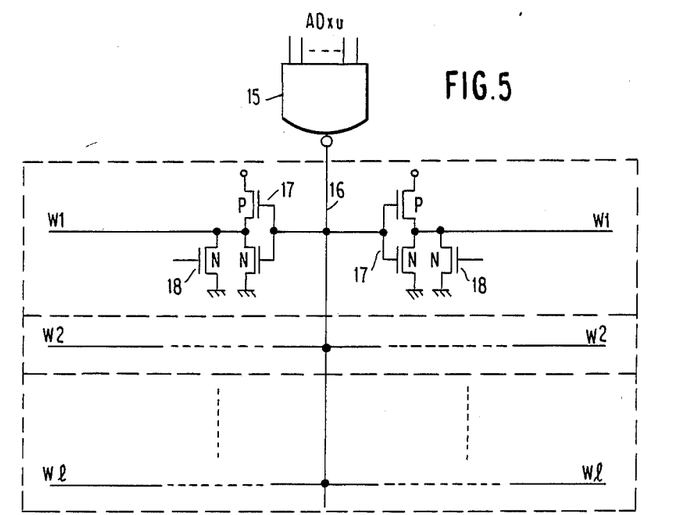
FIG. 5 shows a circuit diagram of an X-decoder shown in FIG. 4.

FIG. 5 shows a circuit diagram of the X-decoder of FIG. 4. A NAND gate 15 receives a plurality of higher ordered address bits ADxu of the address ADx and generates a select signal to an output line 16 commonly coupled to blocks of memory cell arrays. Each block has a CMOS circuit 17 consisting of a P-channel FET and an N-channel FET and an N-channel discharge FET 18. Lower ordered address bits are applied to the N-channel discharge FET 18. In this case, word line pairs $W_1$ to W are simultaneously selected by the NAND gate 15 in a data read operation, and only one of the word line pairs is selected according to the lower address bits. That is, the two N-channel FETs 18 which are connected to the word line pair, respectively, are turned off, so that the read voltage is supplied to the word line pair through the P-channel FETs of the CMOS circuits 17. The other N-channel FETs 18 are turned on, so that the remaining word line pairs are coupled to ground. Thus, only one word line pair is selected in response to an applied address. The X-decoder shown in FIG. 5 is used as a read control decoder.

Figure 6:
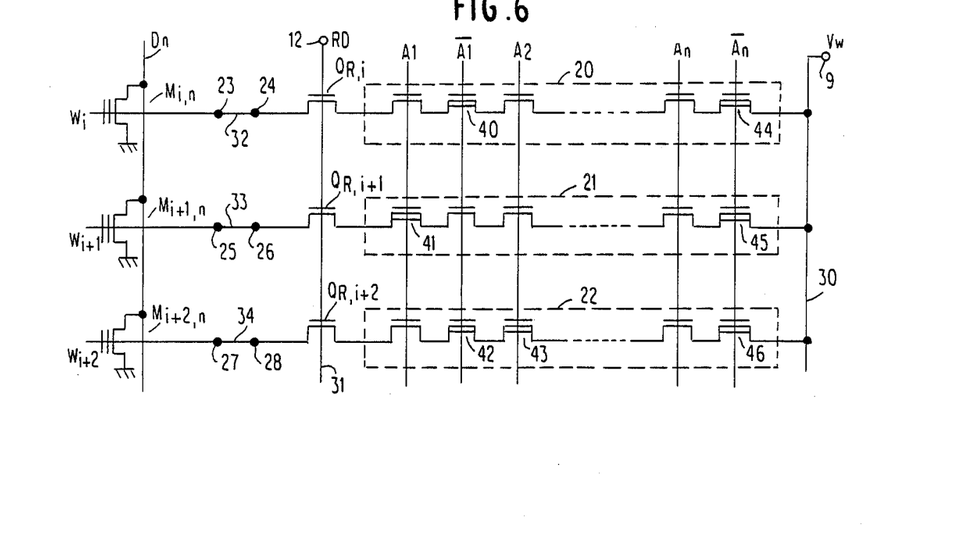
FIG. 6 shows a circuit diagram of a writing circuit corresponding to three word lines of the present invention.

FIG. 6 shows a circuit diagram having three word lines $W_i$, $W_{i+1}$ and $W_{i+2}$ and three switching circuits 20, 21 and 22.

Figure 7:
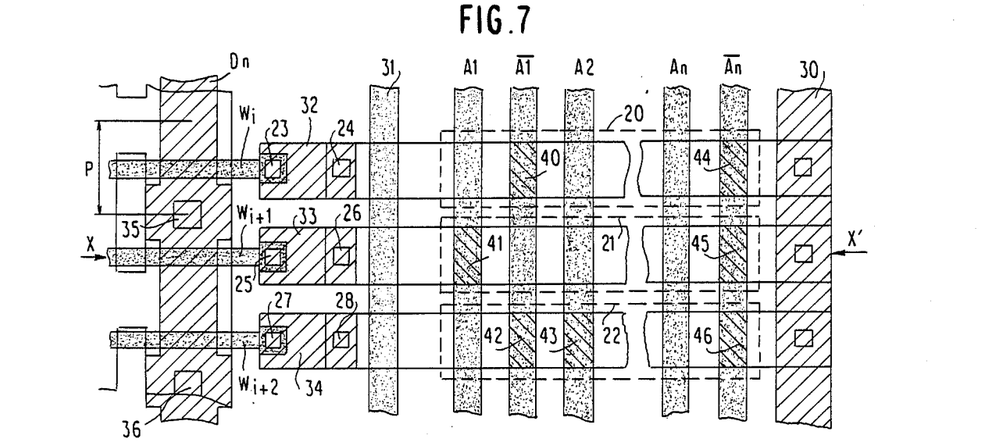
FIG. 7 shows a diagram indicating a plan pattern view of FIG. 6.

FIG. 7 is a plan view of a semiconductor chip on which the circuit shown in FIG. 6 is formed. Each word line $W_i$ to $W_{i+2}$ is made of a polycrystalline silicon layer and is coupled to one end of a respective control gate $Q_{R,i}$ to $Q_{R,i+2}$ via aluminum layers 32 to 34, respectively. In FIG. 7, reference numerals 23, 25 and 27 represent contact portions of word lines and aluminum layers 32 to 34, and 24, 26 and 28 represent contact portions of aluminum layers 32 to 34 and diffusion layers of gate circuits. The other ends of the gate circuits are connected to one ends of the switching circuits 20 to 22 through diffusion layers, respectively. The other ends of the switching circuits 20 to 22 are commonly connected to an aluminum layer 30 connected to the high voltage terminal $V_W9$. The read control signal RD is transferred through a polycrystalline silicon wiring layer 31 to each gate electrode of FETs $Q_{R,i}$ to $Q_{R,i+2}$. The true signals $A_1$ to $A_n$ and the complementary signals $\overline{A}_1$ to $\overline{A}_n$ are transferred through polycrystalline silicon layers to a gate electrode of each FET in the switching circuits 20 to 22. Reference numerals 40 to 46 represent D-FETs in the switching circuits. Drain layers of memory cells $M_{i,n}$ and $M_{i+1,n}$ are commonly connected to an aluminum digit wiring layer $D_n$ via a contact portion 35, while drain layers of memory cell $M_{i+2,n}$ and $M_{i+3,n}$ (not shown) are commonly connected to the aluminum digit wiring layer $D_n$ via a contact portion 36. Source layers of the memory cells $M_{i+1,n}$ and $M_{i+2,n}$ are provided in common between the word lines $W_{i+1}$ and $W_{i+2}$.

As shown in FIG. 7, each switching circuit 20 to 22 can be formed within one memory cell pitch (span) P. Therefore, the memory cell capacity of the semiconductor chip is not reduced when the switching circuits of the present invention are employed.

Figure 8A:
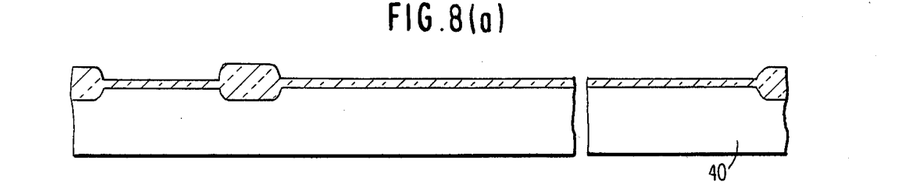
FIGS. 8(a), 8(b) and 8(c) are cross-sectional taken along the X—X' of FIG. 7, illustrating the fabrication process.
Figure 8B:
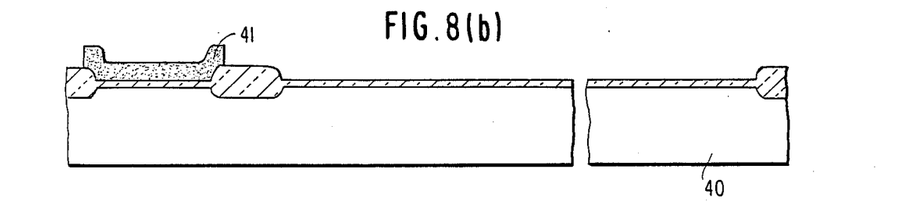
Figure 8C:
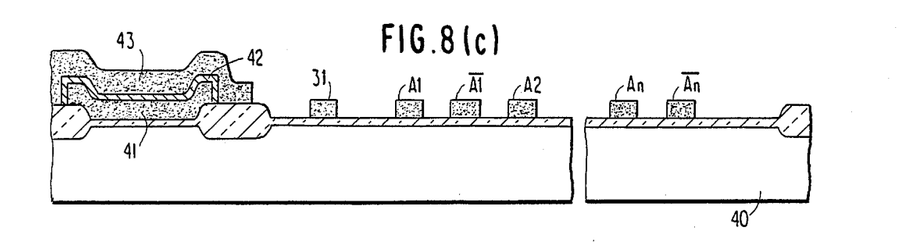
Figure 8D:
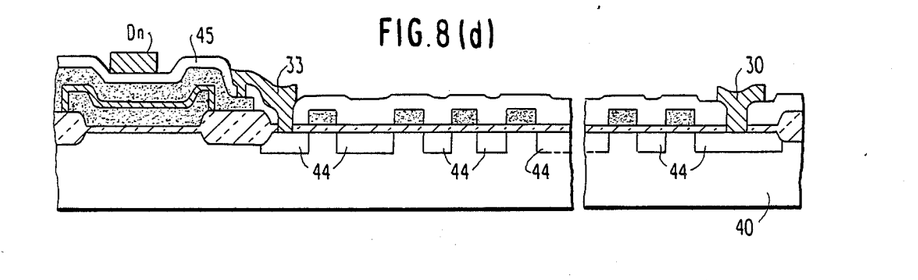

Further, the switching circuits and the gate circuits can be fabricated in the same process as the conventional memory cell manufacture process. This is shown in FIGS. 8(a) to 8(d). In FIG. 8(a), isolation layers and gate insulating films are formed on an N-type semiconductor substrate 40. Thereafter, floating gate electrodes 41 of the memory cells are formed on the gate insulating films by a first polycrystalline silicon patterning (FIG. 8(b)). Next, control gate electrodes 43 are formed on the floating gate electrodes 41 via an insulating film 42 by a second polycrystalline silicon patterning. At the same time, the wiring layers 31 and $A_1$ to $\overline{A}_n$ are formed on a gate film of the switching circuits (FIG. 8(c)). Further, P type diffusion layers 44 are formed, and digit lines $D_n$ and contact lines 30 and 33 are formed via insulating layers 45 such as a phosphosilicate glass (PSG) by an aluminum patterning (FIG. 8(d)). Thus, the switching circuits and gate circuits can be formed without the addition of a new process.

Figure 9:
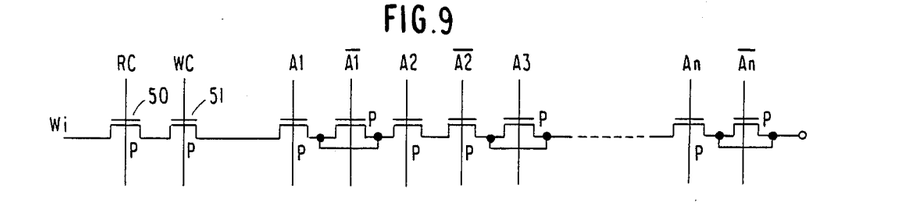
FIG. 9 shows a circuit diagram of still another embodiment of the present invention.

FIG. 9 shows a circuit diagram of a switching circuit and a gate circuit according to another embodiment of the present invention. In this embodiment, two transistors 50 and 51 are used and the switching circuits are made of all E-PFETs However, the drain and source electrodes of each E-PFET corresponding to a D-PFET in the foregoing embodiment are shorted. Further, the transistor 50 is controlled by a read control signal RC and the transistor 51 is controlled by a write control signal WC, both signals being applied to a semiconductor circuit for controlling a data read operation and a data write operation, respectively.

Figure 10A:
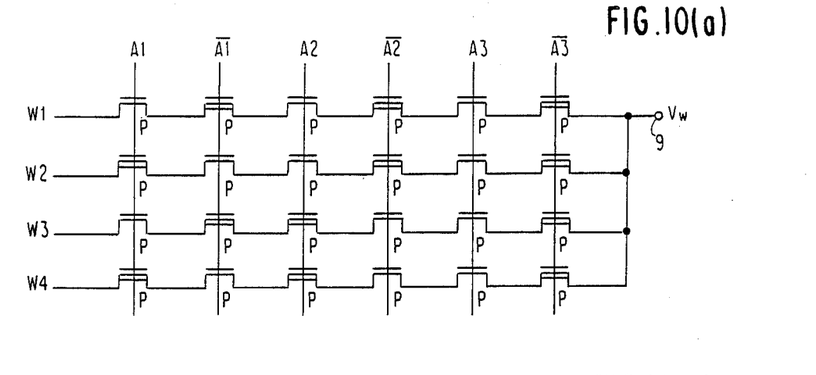
FIG. 10(a) shows a circuit diagram of a writing circuit receiving three address bits.
Figure 10B:
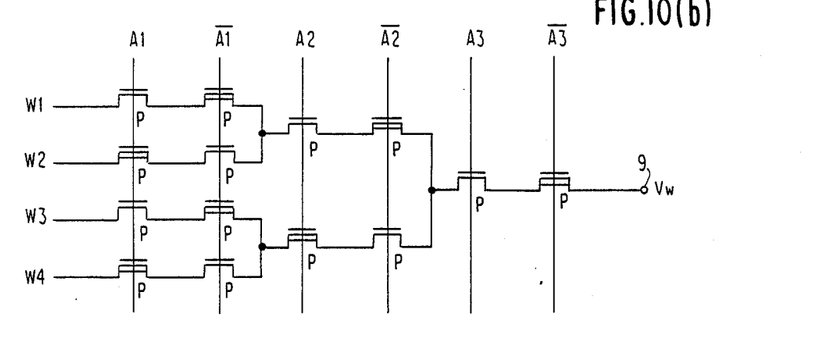
FIG. 10(b) shows an equivalent circuit of FIG. 10(a)
Figure 10C:
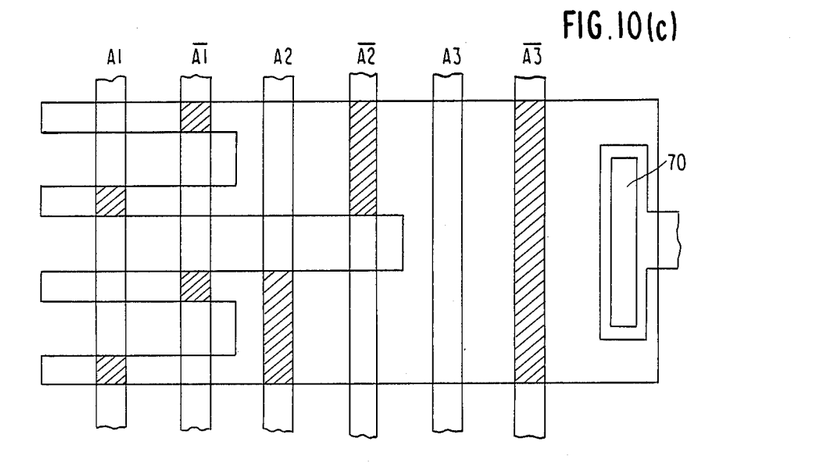
FIG. 10(c) shows a plan view on a semiconductor chip.

FIGS. 10(a), 10(b) and 10(c) show a writing circuit diagram, its equivalent circuit diagram and a plan view, respectively. In FIGS. 10(a) to 10(c), three address bits and four word lines are employed. As shown in FIG. 10(b), the E-PFETs, and D-PFETs which continue in the vertical direction can be replaced by a single FET. Therefore, with respect to these FETs, their channel layers are continued as shown in FIG. 10(c). As a result, the resistance of the switching circuit from the contact portion 70 to each word line can be extremely reduced. Thus, a high-speed data writing operation can be obtained.

What is claimed is:

1. A semiconductor memory device, comprising, a plurality of memory cells, a plurality of row lines, each of which is coupled to at least one of said memory cells, at least one column line coupled to at least one of said memory cells, an address decoder responding to a set of address signals for selecting one row line and one column line to designate one of said memory cells, a terminal at which a writing voltage is supplied, a writing circuit coupled between said row lines and said terminal, said writing circuit having a plurality of switching circuits, first ends of each of said switching circuits being coupled in common to said terminal, a second end of each of said switching circuits being coupled to a respective row line, each of said switching circuits including a plurality of enhancement type transistors and a plurality of depletion type transistors which are serially connected in a predetermined order between respective row line and said terminal, said plurality of enhancement type transistors and said plurality of depletion type transistors of said switching circuits being arranged in rows and columns, rows of said transistors being contained in the same switching circuit, each of said transistors including a channel layer, at least vertically adjacent transistors of the same type and residing in the same column sharing the same channel layer, and a control circuit coupled to said writing circuit and controlling said switching circuits such that all the transistors in that switching circuit coupled to the row line selected by said address decoder are turned on and at least one of the transistors in each of the remaining switching circuits except for that switching circuit coupled to the selected row line is turned off.

2. A semiconductor memory device, comprising, a plurality of memory cells, each of which includes a memory transistor of one conductivity type, a plurality of row lines, each of which is coupled to at least one of said memory cells, at least one column line coupled to at least one of said memory cells, an address decoder responding to a set of address signals for selecting one row line and one column line to designate one of said memory cells, a terminal at which a writing voltage is supplied, a writing circuit coupled between said row lines and said terminal, said writing circuit having a plurality of switching circuits, a first end of each of said switching circuits being coupled in common to said terminal, a second end of each of said switching circuits being coupled to a respective row line, each of said switching circuits including a plurality of switching transistors connected in series between the first and second ends thereof, each of said switching transistors being of an opposite conductivity type to that of said memory transistors, a control circuit coupled to said writing circuit and responding to at least one part of said set of address signals to control said switching circuits such that all the switching transistors in that switching circuit coupled to the row line selected by said address decoder are turned on and at least one of the switching transistors in each of the remaining switching circuits except for that switching circuit coupled to the selected row line is turned off, a plurality of gate transistors of said opposite conductivity type, each of which is inserted between a respective row line and the second end of a respective switching circuit, and means for turning said gate transistors on in a data write operation mode and turning said gate transistors off in a data read operation mode, whereby said selected row line is supplied in said data write operation mode with said writing voltage, without a substantial drop in voltage level, via the associated switching circuit and the associated gate transistor, all the row lines being separated in said data read operation mode from each of said switching circuits by said gate transistors, to reduce the stray capacitance of each of said row lines.

3. A semiconductor memory device as claimed in claim 2, in which each of said switching circuits includes a plurality of enhancement type transistors and a plurality of depletion type transistors which are serially connected in a predetermined order between each row line and said terminal, said control circuit operating to turn off at least one transistor in each of said switching circuits except for that switching circuit coupled to the selected row line.

4. A semiconductor memory device as claimed in claim 2, in which each of said switching circuits includes, as said switching transistors, a plurality of enhancement type transistors and a plurality of depletion type transistors which are serially connected in a predetermined order between the first and second ends of said switching circuits.

5. The semiconductor memory device as claimed in claim 4, further comprising a plurality of gate transistors, each of which is inserted between a respective row line and the second end of a respective switching circuit and means for turning said gate transistors on in a data write operation mode and turning said gate transistors off in a data read operation mode, whereby all the row lines are separated, in said data read operation mode, from each of said switching circuits by said gate transistors to reduce the stray capacitance of each of said row lines.

6. The semiconductor memory device as claimed in claim 5, wherein each of said memory cells includes a memory transistor of one conductivity type and wherein each of said gate transistors and said plurality of enhancement type and depletion type transistors is of an opposite conductivity type to that of said memory transistors.

* * * * *

UNITED STATES PATENT AND TRADEMARK OFFICE
CERTIFICATE OF CORRECTION

PATENT NO. : 4,924,438

DATED : MAY 8, 1990

INVENTOR(S) : HIROYUKI KOBATAKE

It is certified that error appears in the above-identified patent and that said Letters Patent is hereby corrected as shown below:

Column 3, line 54, delete "grund" and insert --ground--.

Signed and Sealed this

Twenty-ninth Day of October, 1991

Attest:

HARRY F. MANBECK, JR.

Attesting Officer

Commissioner of Patents and Trademarks